(12) United States Patent
Murbach et al.

(10) Patent No.: US 11,072,246 B2
(45) Date of Patent: Jul. 27, 2021

(54) ELECTROCHEMICAL CELL DIAGNOSTIC SYSTEMS AND METHODS USING SECOND ORDER AND HIGHER HARMONIC COMPONENTS

(71) Applicant: University of Washington, Seattle, WA (US)

(72) Inventors: Matthew D. Murbach, Seattle, WA (US); Daniel T. Schwartz, Seattle, WA (US)

(73) Assignee: University of Washington, Seattle, WA (US)

( * ) Notice: Subject to any disclaimer, the term of this patent is extended or adjusted under 35 U.S.C. 154(b) by 137 days.

(21) Appl. No.: 15/556,853

(22) PCT Filed: Mar. 11, 2016

(86) PCT No.: PCT/US2016/022119
§ 371 (c)(1),
(2) Date: Sep. 8, 2017

(87) PCT Pub. No.: WO2016/145374
PCT Pub. Date: Sep. 15, 2016

(65) Prior Publication Data
US 2018/0043778 A1     Feb. 15, 2018

Related U.S. Application Data

(60) Provisional application No. 62/131,698, filed on Mar. 11, 2015, provisional application No. 62/280,616, filed on Jan. 19, 2016.

(51) Int. Cl.
*B60L 3/00*     (2019.01)
*B60L 50/50*     (2019.01)
(Continued)

(52) U.S. Cl.
CPC ............. *B60L 50/50* (2019.02); *B60L 3/0046* (2013.01); *B60L 3/12* (2013.01); *G01R 31/367* (2019.01);
(Continued)

(58) Field of Classification Search
None
See application file for complete search history.

(56) References Cited

U.S. PATENT DOCUMENTS

| 4,697,134 A | 9/1987 | Burkum et al. |
| 7,474,228 B2 | 1/2009 | Lockhart et al. |

(Continued)

FOREIGN PATENT DOCUMENTS

WO     2016145374 A1     9/2016

OTHER PUBLICATIONS

Okazaki et al., Second-Order Harmonic in the Current Response to Sinusoidal Perturbation Voltage, 1985.*
(Continued)

*Primary Examiner* — Truc M Do
(74) *Attorney, Agent, or Firm* — Dorsey & Whitney LLP

(57) ABSTRACT

Electrochemical cell diagnostic systems and methods are described. Examples include systems having a signal generator configured to apply a stimulus having a stimulus frequency to at least one electrochemical cell. The stimulus may be configured to excite at least one non-linear mode of the at least one electrochemical cell. Systems may include measurement circuitry configured to detect a response of the at least one electrochemical cell to the stimulus. The response may include a second or greater harmonic component. Systems may include a display device configured to display an indication of an internal state of the at least one electrochemical cell based, at least in part of the second or greater harmonic component of the response.

23 Claims, 6 Drawing Sheets

(51) Int. Cl.
  *G01R 31/392* (2019.01)
  *H01M 10/48* (2006.01)
  *G01R 31/389* (2019.01)
  *G01R 31/367* (2019.01)
  *B60L 3/12* (2006.01)
(52) U.S. Cl.
  CPC ......... *G01R 31/389* (2019.01); *G01R 31/392* (2019.01); *H01M 10/48* (2013.01); *H01M 2220/20* (2013.01)

(56) References Cited

U.S. PATENT DOCUMENTS

| | | | |
|---|---|---|---|
| 7,554,294 B2 | 6/2009 | Srinivasan et al. | |
| 8,467,984 B2* | 6/2013 | Gering | G01R 31/392 702/63 |
| 8,729,904 B2* | 5/2014 | Yount | H01M 10/486 324/434 |
| 8,829,911 B2* | 9/2014 | Rich | H01M 10/42 324/433 |
| 9,046,463 B1 | 6/2015 | Adler et al. | |
| 9,625,532 B2* | 4/2017 | Gering | G01R 31/392 |
| 9,776,643 B2* | 10/2017 | Skaff | B60W 50/14 |
| 9,851,414 B2* | 12/2017 | Morrison | G01R 31/3842 |
| 9,947,497 B2* | 4/2018 | Dulle | B60L 11/1855 |
| 10,209,314 B2* | 2/2019 | Garcia | G05B 23/0283 |
| 2003/0206021 A1 | 11/2003 | Laletin et al. | |
| 2006/0284617 A1* | 12/2006 | Kozlowski | B60L 3/0046 324/426 |
| 2008/0079397 A1* | 4/2008 | Fee | H01M 10/42 320/131 |
| 2011/0062918 A1 | 3/2011 | Prenninger et al. | |
| 2011/0196545 A1* | 8/2011 | Miwa | B60K 6/365 700/292 |
| 2011/0254564 A1 | 10/2011 | Werelius et al. | |
| 2012/0019253 A1* | 1/2012 | Ziegler | H01M 10/48 324/433 |
| 2012/0143435 A1 | 6/2012 | Cho et al. | |
| 2013/0288104 A1* | 10/2013 | Kang | H01M 2/021 429/153 |
| 2013/0314049 A1* | 11/2013 | van Lammeren | G01K 1/026 320/134 |
| 2014/0093760 A1* | 4/2014 | Hermann | H02J 7/0075 429/66 |
| 2014/0278167 A1* | 9/2014 | Frost | G01R 31/3842 702/63 |
| 2015/0066406 A1* | 3/2015 | Sun | B60L 11/1857 702/63 |
| 2015/0198674 A1* | 7/2015 | Kroker | G01R 31/3842 324/430 |
| 2016/0126590 A1* | 5/2016 | Roberts | H01M 10/0564 429/112 |
| 2016/0146895 A1* | 5/2016 | Yazami | H02J 7/027 324/426 |
| 2017/0003354 A1* | 1/2017 | Morrison | G01R 31/3842 |
| 2017/0222448 A1* | 8/2017 | MirTabatabaei | H02J 7/007 |
| 2017/0288414 A1* | 10/2017 | Klein | H01M 10/425 |

OTHER PUBLICATIONS

International Search Report and Written Opinion received for PCT/US2016/022119 dated May 27, 2016.
Andre, et al., "Characterization of high-power lithium-ion batteries by electrochemical impedance spectroscopy," I. Experimental investigation, Journal of Power Sources, 196(12), pp. 5334-5341 (Jun. 2011).
Bloembergen, et al., "Light Waves at the Boundary of Nonlinear Media", Physical Review, 128(2), pp. 606-622 (Oct. 1962).
Cuadras, et al., "SoC Li-ion Battery Monitoring with Impedance Spectroscopy", 6th International Multi-Conference on Systems, Signals and Devices, pp. 1-5 (Mar. 2009).
Darowicki, "Corrosion Rate Measurements by Non-Linear Electrochemical Impedance Spectroscopy", Corrosion Science, 37(6), pp. 913-925 (Jun. 1995).
Darowicki, "Linearization in impedance measurements", Electrochimica Acta, 42(12), pp. 1781-2899 (1997; Retrieved Mar. 2016).
Darowicki, et al., "The effect of a polyharmonic structure of the perturbation signal on the results of harmonic analysis of the current of a first-order electrode reaction", Electrochimica Acta, 44(2-3), pp. 483-490 (Sep. 1998).
Doyle, et al., "Computer Simulations of the Impedance Response of Lithium Rechargeable Batteries", Journal of the Electrochemical Society, 147(1), pp. 99-110 (Jan. 2000).
Doyle, et al., "Modeling of Galvanostatic Charge and Discharge of the Lithium/Polymer/Insertion cell," Journal of the Electrochemical Society, 140(6), pp. 1526-1533 (Jun. 1993).
Eddahech, et al., "Behavior and state-of-health monitoring of Li-ion batteries using impedance spectroscopy and recurrent neural networks", International Journal of Electrical Power & Energy Systems, 42(1), pp. 487-494 (Nov. 2012).
Fuller, et al., "Simulation and Optimization of of the Dual Lithium Ion Insertion Cell", Journal of the Electrochemical Society, 141(1), pp. 1-10 (Jan. 1994).
Giner-Sanz, et al., "Total harmonic distortion based method for linearity assessment in electrochemical systems in the context of EIS", Electrochlmica Acta, 186, pp. 598-612 (Dec. 2015).
Heubner, et al., "Investigation of charge transfer kinetics of Li-Intercalation in LiFePO4", Journal of Power Sources, 288; pp. 115-120 (Aug. 2015).
Hirschorn, et al., "Effect of Large Perturbation Amplitudes on the Impedance Response of an Electrochemical System", ECS Transactions, 13(13), pp. 81-100 (May 2008).
Hyun, et al., "A review of nonlinear oscillatory shear tests; Analysis and application of large amplitude oscillatory shear (LAOS)", Progress in Polymer Science. 36(12) pp. 1697-1753 (Dec. 2011).
Johnson, et al., "Desalting by means of porous carbon electrodes", Journal of the Electrochemical Society, 118(3), pp. 510-517 (Mar. 1971).
Karden, et al., "A method for measurement and interpretation of impedance spectra for industrial batteries", Journal of Power Sources, 85(1), pp. 72-78 (Jan. 2000).
Kiel, et al., "Harmonic analysis for identification of nonlinearities in impedance spectroscopy", Electrochimica Acta, 53(25), pp, 7367-7374 (Oct. 2008).
Macdonald, "Reflections on the history of electrochemical impedance spectroscopy", Electrochimica Acta, 51(8-9), pp. 1376-1388 (Jan. 2006).
Medina, et al., "Nonlinear Dynamics of Limiting Current in the Flow-Modulated Uniform-Injection Cell", Journal of the Electrochemical Society, 144(1), pp. 155-164 (Jan. 1997).
Medina, et al., "Nonlinear dynamics of modulated flow between a porous injector and an impermeable substrate", Phys of Fluids, 8(11), pp. 2895-2905 (Nov. 1996).
Niya, et al., "Study of proton exchange membrane fuel cells using electrochemical impedance spectroscopy technique—A review", Journal of Power Sources, 240, pp. 281-293 (Oct. 2013).
Osaka, et al., "Review—Development of Diagnostic Process for Commercially Available Batteries, Especially Lithium Ion Battery, by Electrochemical Impedance Spectroscopy", Journal of the Electrochemical Society, 162(14), pp. A2529-A2537 (Oct. 2015).
Rezvanizaniani, et al., "Review and recent advances in battery health monitoring and prognostics technologies for electric vehicle (EV) safety and mobility", Journal of Power Sources, 256, pp. 11-124 (Jun. 2014).
Saha, et al., "Prognostics Methods for Battery Health Monitoring Using a Bayesian Framework", IEEE Transactions on Instrumentation and Measurement, 58(2), pp. 291-296 (Feb. 2009).
Schwartz, "Measurements of steady axial streaming at a rotating disc with torsional oscillations", Proceedings of the Royal Society A: Mathematical, Physical and Engineering Sciences, 442(1915), pp. 397-407 (Aug. 1993).
Shen, "Surface properties probed by second-harmonic and sum-frequency generation", Nature, 337, pp. 519-525 (Feb. 1989).

(56) References Cited

OTHER PUBLICATIONS

Wilson, et al., "Full-spectrum nonlinear response of a sinusoidally modulated rotating disk electrode", Physics of Fluids, 17, pp. 063601-1-063601-11 (2005; Retrieved Sep. 2016).
Wilson, et al., "Nonlinear electrochemical impedance spectroscopy for solid oxide fuel cell cathode materials", Electrochimica Acta, 51(8-9), pp. 1389-1402 (Jan. 2006).
Zhong, et al., "A review of electrolyte material and compositions for electrochemical supercapacitors", Chemical Society Reviews, 44(21), pp. 7484-7539 (epub Jun. 2015).
Schwartz, Daniel , "Probing the nonlinear dynamics of a battery to gain new diagnostic insights" Presented on Jan. 19, 2016.

\* cited by examiner

ELECTROCHEMICAL CELL DIAGNOSTIC SYSTEMS AND METHODS USING SECOND ORDER AND HIGHER HARMONIC COMPONENTS

CROSS-REFERENCE TO RELATED APPLICATIONS

This application is a 35 U.S.C. § 371 National Stage Application of PCT Application No. PCT/US2016/022119, filed on Mar. 11, 2016, which claims filing benefit under 35 U.S.C. § 119(e) of the earlier filing dates of U.S. Application Ser. No. 62/131,698, filed Mar. 11, 2015, and 62/280,616, filed Jan. 19, 2016. All afore-mentioned applications are hereby incorporated by reference in their entirety for any purpose.

STATEMENT REGARDING RESEARCH & DEVELOPMENT

This invention was made with government support under contract P200A 120023 awarded by the U.S. Department of Education and under contract DGE-1258485 awarded by the National Science Foundation. The government has certain rights in the invention.

TECHNICAL FIELD

Examples described herein relate to diagnostics for electrochemical cells and includes examples of nonlinear analysis for batteries.

BACKGROUND

Energy storage has the capability to dramatically reduce global greenhouse gas emissions by fundamentally changing the way energy is delivered and consumed, including by the transportation sector and electric utilities. To date, battery implementation in our vehicles and electric grid has been slow and limited to a few earlier adopters willing to pay a premium over other technologies. Today, batteries are discarded prematurely and operated under overly conservative protocols due to limited information on the health of the battery.

The true benefits of energy storage are still severely limited by high costs as batteries remain a major expense for utilities and car manufacturers. Moreover, despite their significant cost, batteries are not currently used to their full potential in a rudimentary effort to prolong their useful life and avoid unsafe conditions that can result in catastrophic events. For example, electric vehicle (EV) batteries are often replaced when their capacity (and thus the vehicle's driving range) decreases to a maximum of 70%. Although these batteries may no longer be suitable for EV use, their remaining capacity offers a significant value that is currently unrealized in the market. Recycling the individual cells is an option; however, it is difficult to extract components that still have value. There are also environmental impacts from discarding and recycling batteries such as release of process gasses into the atmosphere as well as other toxic chemicals that must be dealt with. Ensuring that each battery is used to its full potential can reduce the environmental burden of manufacturing and recycling additional batteries.

Implementing cost effective energy storage is difficult in part due to a lack of information about the asset itself. It is difficult to get quality data related to the health of batteries. Despite the complexity and safety concerns associated with lithium ion batteries, current technologies use relatively simplistic methods of estimating critical battery parameters and information. This inaccuracy leads to large safety margins and poor application of optimization protocols contributing to high costs and uncertainty about remaining useful life. This uncertainty makes it difficult to resell a used electrical vehicle battery to a secondary market since the buyer has no assurances about the quality of the system.

SUMMARY

Examples of methods are described herein. Some example methods include stimulating non-linear modes of at least one electrochemical cell using a stimulus having a stimulus frequency and detecting a response of the at least one electrochemical cell. A response frequency of the response may be a second or greater harmonic of the stimulus frequency. Based, at least in part, on the response, methods may include displaying an indication of an internal state of the at least one electrochemical cell.

In some examples, displaying the indication of the internal state comprises displaying an indication of degradation. The indication of degradation may include an indication of asymmetry in a charging and discharging behavior of the at least one electrochemical cell.

In some examples, the stimulus frequency is selected to be above frequencies at which thermodynamic relationships and slow mass transfer dominate the response.

In some examples, displaying the indication of the internal state of the at least one electrochemical cell may include displaying an indication of degradation when the response exceeds a threshold magnitude.

In some examples, the at least one electrochemical cell comprises a lithium ion battery. In some examples, the at least one electrochemical cell comprises a battery in an electric vehicle. Stimulating the non-linear modes of the at least one electrochemical cell may include applying the stimulus during braking of the electric vehicle. Stimulating the non-linear modes of the at least one electrochemical cell may include applying the stimulus using a charging cable of the electric vehicle.

In some examples, displaying the indication of the internal state of the at least one electrochemical cell may include displaying an indication of remaining life of the at least one electrochemical cell.

In some examples, the at least one electrochemical cell includes a battery in an electric vehicle, and displaying the indication of the internal state of the at least one electrochemical cell comprises displaying an indication of estimated range of the electric vehicle using the battery.

Some example methods further include performing a comparison of the response with electronic signatures indicative of particular internal states, and wherein displaying the indication of the internal state is based, at least in part, on the comparison.

Example electronic signatures may include Nyquist plot shapes of a second or higher harmonic component at different degradation states. The indication of the internal state may include an indication of degradation.

Example electronic signatures include thresholds of real impedance of a second or higher harmonic component at different degradation states. The indication of the internal state may include an indication of degradation.

Example systems are described herein. An example system may include a signal generator configured to apply a stimulus having a stimulus frequency to at least one electrochemical cell. The stimulus may be configured to excite at least one non-linear mode of the at least one electrochemical cell. Example systems may further include measurement circuitry configured to detect a response of the at least one electrochemical cell to the stimulus wherein the response includes a second or greater harmonic component. Example systems may further include a display device configured to display an indication of an internal state of the at least one electrochemical cell based, at least in part of the second or greater harmonic component of the response.

In some examples, the stimulus frequency is selected to be above frequencies at which thermodynamic relationships and slow mass transfer dominate the response.

In some examples, the at least one electrochemical cell comprises a battery of an electric vehicle.

In some examples, the signal generator includes a component of a charging system for the electric vehicle.

In some examples, the signal generator may be configured to apply the stimulus during braking of the electric vehicle.

In some examples, the indication of the internal state includes an indication of a range of the electric vehicle using the battery.

In some examples, the indication of the internal state includes an indication of degradation of the battery.

Some example systems further include a memory configured to store electronic signatures representative of particular internal states. Example systems may further include at least one processing unit configured to conduct a comparison of the second or greater harmonic component of the response with the electronic signatures. The indication of the internal state may be based, at least in part, on the comparison.

In some examples, the electronic signatures are derived from empirical data.

Example systems may further include at least one processing unit and a memory encoded with executable instructions for modeling that, when executed, cause the at least one processing unit to model behavior of the at least one electrochemical cell using parameters for electrode asymmetry.

In some examples, the executable instructions for modeling further include instructions for predicting a predicted response of the at least one electrochemical cell and comparing the predicted response with the response, and wherein the indication of the internal state is based, at least in part, on the comparing.

In some examples, the executable instructions for modeling further include instructions for fitting a model to the response.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, electrochemical cell components and materials, control signals, timing protocols, and software operations have not been shown in detail in order to avoid unnecessarily obscuring the described embodiments of the invention.

Examples described herein relate to diagnostics for electrochemical cells (e.g. batteries) facilitated by nonlinear responses of the electrochemical cells. Nonlinear responses generally refer to responses which include second and/or higher order harmonic components. Generally, an electrochemical cell (e.g. a battery cell) may be stimulated with either an oscillating current or voltage stimulus at a specified frequency (or combination of frequencies) in order to drive a nonlinear response within the electrochemical cell.

The nonlinear response is characterized by a response signal containing not just the fundamental (e.g. stimulus) frequency, but also integer multiples of the fundamental frequency (and in some examples the sums and differences between frequencies when a combination of input frequencies are used.)

Figure 1:
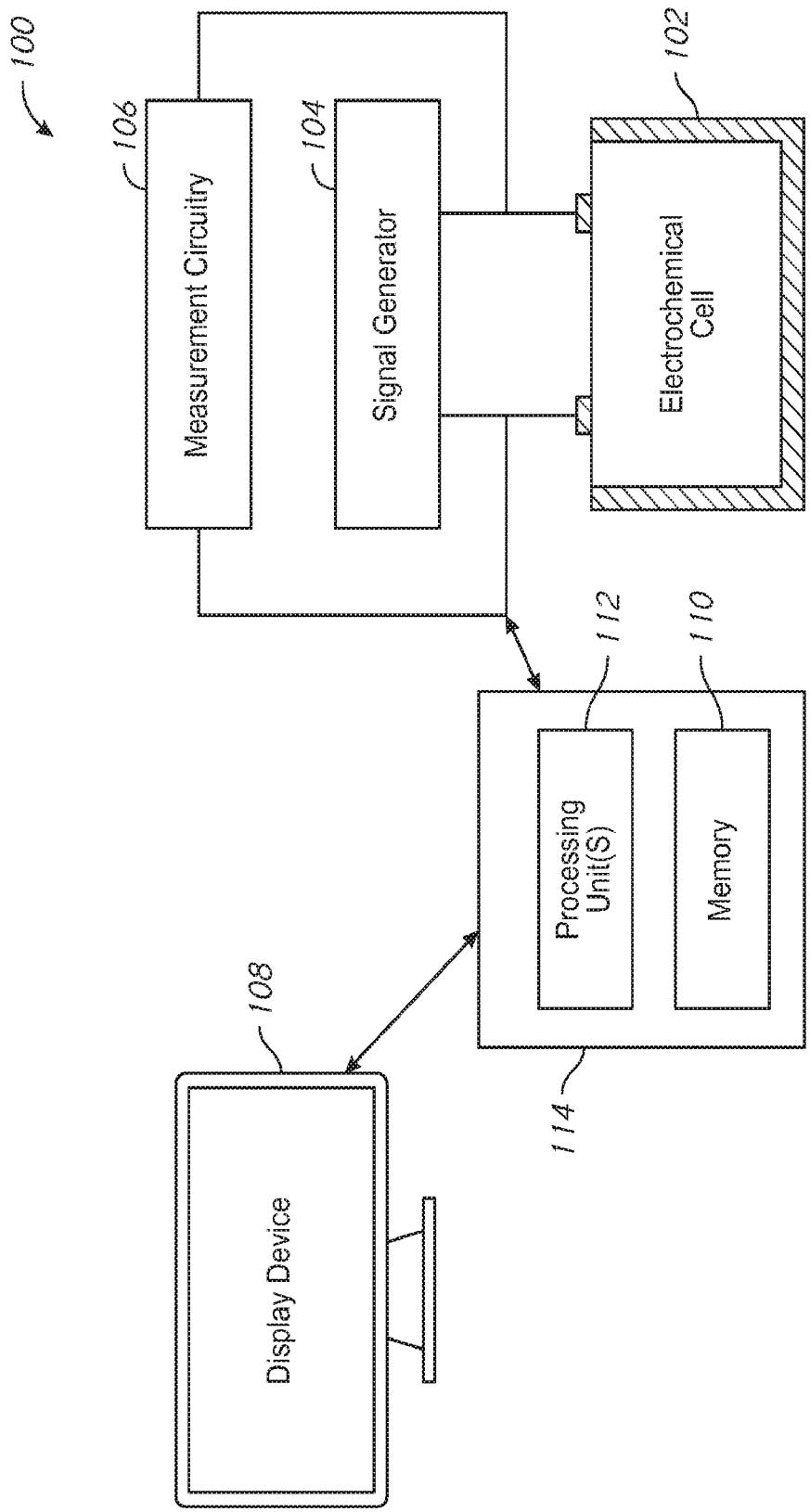
FIG. 1 is a schematic illustration of a system arranged in accordance with examples described herein.

FIG. 1 is a schematic illustration of a system arranged in accordance with examples described herein. The system 100 includes an electrochemical cell 102, a signal generator 104, measurement circuitry 106, a computing device 114 which may include one or more processing unit(s) 112 and memory 110, and a display device 108.

The signal generator 104 and the measurement circuitry 106 may be connected to the electrochemical cell 102. For example, the signal generator 104 and measurement circuitry 106 may be electrically connected to one or more electrodes of the electrochemical cell 102. The signal generator 104 may apply one or more stimuli to the electrochemical cell 102, and the measurement circuitry 106 may measure a response of the electrochemical cell 102 to the stimuli.

A computing device 114 may be coupled to the measurement circuitry 106 and/or signal generator 104. The computing device 114 may include one or more processing unit(s) 112 (e.g. processor(s), custom circuitry, or combinations thereof) and memory 110. The computing device 114 may be programmed (e.g. by encoding the memory with executable instructions) to perform actions described herein. The computing device 114 may control operation of the measurement circuitry 106 and/or signal generator 104 in some examples. The computing device 114 may receive measurements from the measurement circuitry 106 and/or analyze data received from the measurement circuitry 106.

A display device 108 may be coupled to the computing device 114 and/or to the measurement circuitry 106. The display device 108 may display an indication of the internal state of the electrochemical cell 102 in accordance with the measurements taken by the measurement circuitry 106.

Any of a variety of electrochemical cells may be utilized in systems described herein. The electrochemical cell 102, for example, may be implemented using a battery, such as a lithium ion battery. The electrochemical cell 102 may be implemented using a fuel cell in some examples. Although a single electrochemical cell 102 is shown in FIG. 1, multiple electrochemical cells may be used in example systems. In some examples, each electrochemical cell may receive individual respective stimuli and have a measured individual response. In some examples, multiple electrochemical cells may be stimulated together and a combined response received and analyzed as described herein.

A battery used to implement the electrochemical cell 102 may be an electric vehicle battery. Generally, electric vehicles include 'hybrid' vehicles which may operate from time to time on battery power and from time to time using fossil fuels.

The signal generator 104 may apply a stimulus having a stimulus frequency to the electrochemical cell 102. The stimulus (e.g. perturbation signal) may be selected to excite at least one non-linear mode of the electrochemical cell 102. For example, the stimulus may be a current signal having a particular frequency. In some examples, the stimulus may be a voltage signal having a particular frequency. In some examples, multiple stimuli may be provided. For example respective stimulus signals may be provided, each having a respective frequency, to obtain a response from the electrochemical cell 102 across a number or range of frequencies.

The stimulus may be selected to excite at least one non-linear mode of the electrochemical cell 102. For example, the stimulus may have an amplitude selected to elicit second order and/or higher harmonic components in the response. For example, at low perturbation amplitudes, a largely linear response (e.g. no significant higher harmonics) may be measured; however, as the perturbation amplitude is increased, the second and/or third and/or higher harmonics begin to be distinguishable from the noise as a function of the perturbation amplitude squared and cubed, respectively.

The stimulus frequency may refer to a frequency of oscillation of the stimulus signal, a periodicity of the stimulus signal, or combinations thereof. Any of a variety of stimulus signals may be used including, but not limited to, sine waves, square waves, triangle waves, impulses, and combinations thereof. In examples where the electrochemical cell 102 is implemented as a battery, the stimulus frequency or frequencies may in some examples be in the range of 10 mHz to 10 kHz.

The stimulus frequency may be selected to investigate a particular physical process or processes taking place in the electrochemical cell 102. Different frequencies generally may be used to investigate processes occurring on different timescales. For example, at low frequencies, thermodynamic relationships and slow mass transfer may generally dominate the system; however, as the frequency of the perturbation signal increases, the positive and negative electrode reaction kinetics and double-layer capacitances may result in characteristic responses. Similarly, these time constants may be reflected in the higher harmonic response as well, allowing methods described herein to resolve the electrochemical cell's internal state more clearly in some examples than current diagnostic technology based on static current/voltage measurements.

In some examples, the stimulus frequency is selected to be outside (e.g. above) a range at which thermodynamic relationships and slow mass transfer dominate the response of the electrochemical cell 102. The frequencies at which thermodynamic relationships and slow mass transfer dominate the response of the electrochemical cell 102 may generally be above 10-100 Hz, above 0.5 Hz in some examples, above 1 Hz in some examples, above 5 Hz in some examples, above 10 Hz in some examples, above 50 Hz in some examples, above 100 Hz in some examples, above 200 Hz in some examples, above 300 Hz in some examples, above 400 Hz in some examples, above 500 Hz in some examples, above 600 Hz in some examples, above 700 Hz in some examples, above 800 Hz in some examples, above 900 Hz in some examples, above 1000 Hz in some examples.

Determining the frequency at which the electrochemical cell is above the thermo/mass transfer regime may be performed in some examples by theoretically calculating the different timescales of diffusion and kinetics. In some examples, the frequency at which the electrochemical cell is above the thermo/mass transfer regime may be performed experimentally, for example by measuring a full spectra of a battery and modeling the particular ranges over which the mass transfer or kinetics dominate. For some example batteries, this approximate point is ~1 Hz (e.g. above 10 Hz the cell is squarely in the kinetics regime and below 0.1 Hz the cell is in the mass transfer regime.) In some examples, a single frequency or selected group of frequencies may be probed rather than a full spectra of the electrochemical cell.

The signal generator 104 may be implemented, for example, using a voltage source, a current source, or other signal generating circuitry or devices. The signal generator 104 may include a data acquisition (DAQ) board/computer/power amplifier setup. Various electrodes may be used to physically apply and receive the signals from the battery or other test device. Additional or alternative equipment may be used as well. In some examples, the signal generator 104 may be implemented using a portion of a charging system for an electric vehicle. In some examples, the signal generator 104 may be implemented using an electric motor of an electric vehicle and/or braking systems of an electric vehicle. In some examples, for example where data for battery diagnostics is desired during operation of the vehicle, the signal generator 104 may apply a stimulus to the electrochemical cell 102 during operation of the vehicle, such as during braking. The system 100 may include one or more sensors (e.g. vehicle sensors) which may provide an indication to the signal generator 104 (e.g. directly or through the computing device 114) that braking is occurring. Responsive to the indication that braking is occurring; the signal generator 104 may provide a stimulus to the electrochemical cell 102.

The measurement circuitry 106 may detect a response of the electrochemical cell 102 to the stimulus provided by the signal generator 104. The response may include a second or greater harmonic component. Harmonic component generally refers to a component of a response occurring at a harmonic frequency relative to the stimulus frequency. A second harmonic, for example, may be a portion of the response occurring at twice the stimulus frequency. A third harmonic, for example, may be a portion of the response occurring at three times the stimulus frequency.

In some examples, for example where the signal generator 104 provides a voltage stimulus, the measurement circuitry 106 may measure a current response. In some examples, for example where the signal generator 104 provides a current stimulus, the measurement circuitry 106 may measure a voltage response.

The measurement circuitry 106 may be implemented, for example, using circuitry for detection of a voltage or current between electrodes of the electrochemical cell 102.

When the stimulus frequency is selected to be outside the range where thermodynamics and mass transfer dominate, the second harmonic component of the response (which may be measured by the measurement circuitry 106) may be indicative of the symmetry of the reaction kinetics in the electrochemical cell 102. For example, in a perfectly symmetric rechargeable battery (e.g. reflecting an ideal reaction in which charging and discharging are equally easy) the second harmonic component of the response may approach zero. As such, perturbing a battery at this amplitude and frequency may generate a harmonic signature useful in understanding any breakdown in the symmetry of the reaction kinetics as well as the presence of degradative (e.g. generally non-symmetric/irreversible) side reactions. Additionally, in some examples the size of the harmonics (which may be scaled by ratios) may be related to the historical normal use vs. abuse cases in a battery. For example, a shape of the third harmonic component of the response in this frequency range may grow in magnitude as the damage to the battery (e.g., the depth to which the cell was overdischarged) is increased.

In some examples, electronic signatures may also be used to predict a remaining usable lifetime of a battery. For example, a particular pattern or threshold of second-order or higher harmonics may be indicative of a particular remaining usable lifetime. In some examples, second-order or higher harmonics may be sensitive to the inhomogeneity in the battery and may be used to predict a state-of-power of the battery (e.g. the battery's propensity to accept and/or deliver a particular charge or discharge power). Electronic signatures may be used which are indicative of the state-of-power of the battery. In some examples, electronic signatures may be used to estimate physical and/or empirical parameters for battery modeling and/or control.

A computing device 114 may be coupled to the measurement circuitry 106 and/or the signal generator 104. The computing device 114 may analyze the response detected by the measurement circuitry 106. For example, the computing device 114 may analyze a second or third harmonic component of the response in some examples. The computing device 114 may determine an indication of an internal state of the electrochemical cell 102 based on the analysis of harmonic components of the response, such as the second and/or third harmonic components.

Examples of internal states of the electrochemical cell which may be determined in accordance with examples described herein include, but are not limited to, degradation of the electrochemical cell, asymmetry of the electrochemical cell, remaining charge of the electrochemical cell, and combinations thereof. Another example of internal state of the electrochemical cell 102, for example when the electrochemical cell 102 is implemented using an electric vehicle battery, is range of the battery (e.g. mileage the vehicle is estimated to be able to go given the current charge of the battery).

The computing device 114 may be implemented, for example, using one or more computing systems such as a server, controller, microcontroller, desktop, laptop, tablet, mobile phone, appliance, automobile, or combinations thereof.

It is to be understood that arrangement of components of the computing device 114 may be quite flexible, and although processing unit(s) 112 and memory 110 are shown together in FIG. 1, these components may be distributed and electronic communication in some examples. In some examples, more than one memory device may be used, and the memories may be co-located or distributed. The computing device 114 may be programmed (e.g. the memory 110 may be encoded with executable instructions which, when executed, cause the computing device 114 to perform actions described herein).

In some examples, the memory 110 may include electronic signatures indicative of various internal states of the electrochemical cell 102. For example, threshold values for second or higher order harmonics may be stored in the memory 110. In other examples, electronic signatures may include amplitudes of responses across particular frequency ranges indicative of a particular internal state—e.g. degradation, range value, asymmetry value, charge level. The electronic signatures may be developed from empirical data in some examples. For example, other electrochemical cells (not shown in FIG. 1) may be measured in certain known internal states—e.g. degradation, range values, asymmetry values, charge levels. The second and higher order harmonic responses of these electrochemical cells in known states may be determined and stored as electronic signatures of the state.

The processing unit(s) 112 may conduct a comparison of the second or greater harmonic component of the response with the electronic signatures (e.g. in accordance with executable instructions stored, for example, in memory 110, and/or in accordance with custom circuitry or firmware). The processing unit(s) 112 may determine an internal state of the electrochemical cell 102 based, at least in part, on the comparison.

The computing device 114 may compute a Fourier transform (e.g. a Fast Fourier Transform) of the stimulus provided by the signal generator 104 and/or the response measured by the measurement circuitry 106. The Fourier transform may yield Fourier coefficients, generally representing a magnitude for each of a plurality of harmonic components of the signal. These components may be used to conduct analysis described herein.

In some examples, the computing device 114 may compute a model of the electrochemical cell 102. For example, the computing device 114 may be programmed (e.g. the memory 110 may be encoded with executable instructions for modeling) such that the processing unit(s) 112 may model behavior of the electrochemical cell 102. The model used may include parameters for electrode asymmetry. The parameters for electrode asymmetry may be derived from measurements of second order harmonic responses of electrochemical cells. The model may utilize non-symmetric charge transfer coefficients in some examples. In some examples, the computing device 114 may compare a response of the electrochemical cell 102 to a modeled (e.g. predicted) response of the electrochemical cell 102. In some examples, an indication of the internal state of the electrochemical cell 102 may be identified based on the comparison between the modeled (e.g. predicted) response and the measured response. In some examples, the measured response may be used to fit the model to the measured response, which may in some examples improve the accuracy of the model in predicting future responses.

A display device 108 may be in communication with the computing device 114. The display device 108 may be wired or wireless communication with the computing device 114. The display device 108 may display an indication of the internal state of the electrochemical cell 102 based on the second or greater harmonic component of the response. The display device 108 may be implemented using, for example, an LCD, LED, or holographic display. The display device 108 may be implemented for example using a display, a dashboard, a heads-up display, an augmented or virtual reality display, or combinations thereof.

Figure 2:
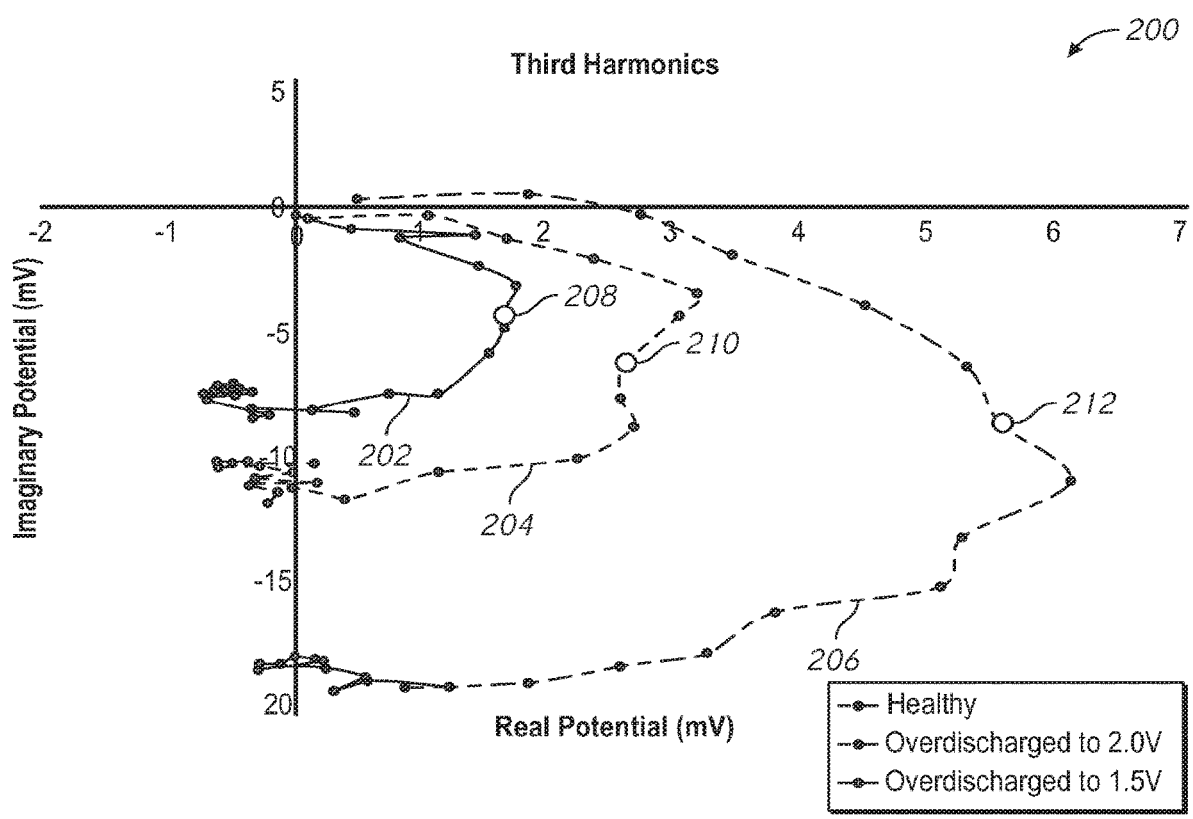
FIG. 2 is a Nyquist plot of a response of a battery at several states of degradation.

FIG. 2 is a Nyquist plot of a response of a battery at several states of degradation.

The Nyquist plot 200 depicts the imaginary and real potential of the third harmonic component of a battery's response (e.g. transfer function) over a range of frequencies. The Nyquist plot 200 depicts the real portion of the transfer function (e.g. voltage in mV) along the x axis and the imaginary portion of the transfer function (e.g. voltage in mV) along the y axis. The Nyquist plot 200 includes line 202, line 204, and line. Line 202 represents third harmonic components of responses of the battery across a range of frequencies when the battery is healthy. Line 204 represents third harmonic components of responses of the battery across a range of frequencies when the battery has been overdischarged a moderate amount (e.g. overdischarged to 1.5V in an example). The line 206 represents the third harmonic component of responses of the battery across a range of frequencies when the electrochemical cell 102 has been significantly overdischarged (e.g. overdischarged to 2.0V in an example).

In some examples, the Nyquist plot 200 may represent empirical data that may be used to develop electronic signatures described herein. For example, shapes of the lines 202, 204, and 206 may be stored in, for example, the memory 110 of FIG. 1. The signal generator 104 may provide a stimulus across a range of frequencies to the electrochemical cell 102, and the measurement circuitry 106 may measure at least third harmonic components of the response of the electrochemical cell 102. The computing device 114 may compare the response measured by the measurement circuitry 106 to the stored electronic signatures (e.g. the lines 202, 204, 206) to determine which is a best match, and provide an indication of the internal state of the electrochemical cell 102 (e.g. if the electrochemical cell 102 is healthy, moderately overdischarged, or significantly overdischarged). If the measured response is best matched to the line 202, the computing device 114 may provide an indication that the electrochemical cell 102 is healthy. If the measured response is best matched to the line 204, the computing device 114 may provide an indication that the electrochemical cell 102 has been moderately overdischarged. If the measured response is best matched to the line 206, the computing device 114 may provide an indication that the electrochemical cell 102 has been significantly overdischarged.

Accordingly, in examples described herein Nyquist plot shapes of second, third, or higher order harmonics may be utilized as electronic signatures. Second, third, or higher order harmonic Nyquist plot shapes may be responses of electrochemical cells which may be analyzed to provide an indication of the internal state of electrochemical cells described herein.

Nyquist plots may involve stimulating and measuring responses of electrochemical cells across a range of frequencies. In some examples, a single frequency may be used to stimulate the electrochemical cell and a threshold may be used to provide indication of an internal state of the electrochemical cell.

Referring again to FIG. 2, point 208, point 210, and point 212 are points on line 202, line 204, and line 206 respectively which were taken at a same frequency. Accordingly, it can be seen that a threshold of real potential magnitude may be used to discern between line 202, line 204, and line 206 at the frequency at which the points 208, 210, and 212 were taken. In some examples, the memory 110 of FIG. 1 may store a real potential threshold value of, for example between the values of points 208 and 210 as a moderate degradation threshold, and a real potential threshold value of, for example, between the values of points 210 and 212 as a significant degradation threshold.

In operation, the signal generator 104 may provide a stimulus to the electrochemical cell 102 at a frequency to which the points 208, 210, and 212 correspond. The third harmonic component of the response may be measured by measurement circuitry 106 and analyzed by the computing device 114. If the real potential is below the first threshold, the computing device 114 may provide an indication of the internal state of the electrochemical cell 102 as healthy. If the real potential is above the first threshold but below the second threshold, the computing device 114 may provide an indication of the internal state of the electrochemical cell 102 as moderately degraded. If the real potential is above the second threshold, the computing device 114 may provide an indication of the internal state of the electrochemical cell 102 as significantly degraded.

Figure 3:
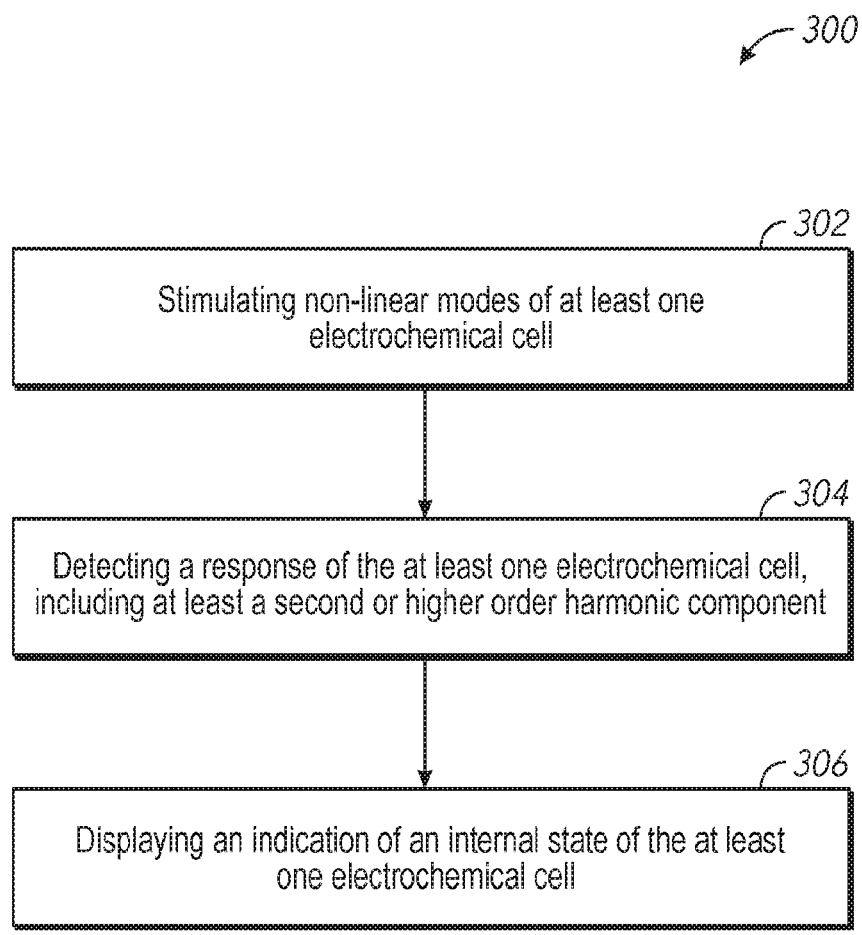
FIG. 3 is a flowchart of a method arranged in accordance with examples described herein.

FIG. 3 is a flowchart of a method arranged in accordance with examples described herein. The method 300 may be implemented, for example using the system 100 of FIG. 1.

The method 300 includes stimulating non-linear modes of at least one electrochemical cell in block 302, detecting a response of the at least one electrochemical cell, including at least a second or higher order harmonic component in block 304, and displaying an indication of an internal state of the at least one electrochemical cell in block 306.

Block 302 recites stimulating non-linear modes of at least one electrochemical cell. For example, the electrochemical cell 102 may be stimulated by the signal generator 104. Non-linear modes generally refer to modes at which second order or higher harmonic components are present above a noise level in the response. From a physical perspective, the non-linear modes may refer to operational regions beyond where thermodynamic relationships and slow mass transfer operations dominate the electrochemical cell behavior.

In some examples, a frequency and/or amplitude of the stimulus may be selected to elicit a non-linear response from the electrochemical cell. For example, a frequency and magnitude may be selected which are sufficiently large to yield a second, third, and/or higher order harmonic component in the response which is greater than a noise level.

Voltage and/or current signals may be provided to electrodes of an electrochemical cell (e.g. a battery) in block 302 to achieve the described stimulating. In some examples, a single frequency may be used. In other examples, a range of stimulus frequencies and/or multiple stimulus frequencies may be used.

Stimulating in block 302 may occur at rest or during use of a system containing the electrochemical cell. For example, the electrochemical cell may be implemented using a battery, such as an electric vehicle battery. The stimulating in block 302 may occur during vehicle use, such as during braking. In some examples, the stimulating in block 302 may occur periodically (e.g. hourly, daily, weekly, monthly) as a routine battery diagnostic. Periodic stimulation may allow for tracking of the electrochemical cell's performance over time, and may allow in some examples for a warning or other indication to be provided when the electrochemical cell's performance falls below a threshold.

Block 304 recites detecting a response of the at least one electrochemical cell, including at least a second or higher order harmonic component. Generally, the second or higher order harmonic component may refer to a second or greater harmonic of the stimulus frequency. For example, the measurement circuitry 106 of FIG. 1 may detect a response of the electrochemical cell 102.

Block 306 recites displaying an indication of an internal state of the at least one electrochemical cell. For example, the display device 108 of FIG. 1 may display indication of the internal state. The indication of the internal state may be based, at least in part, on the second or higher order harmonic components of the response detected in block 304.

Any of a variety of indication of the internal state may be displayed, as discussed herein, including an indication of degradation. In some examples, the indication of degradation may include an indication of asymmetry in a charging and discharging behavior of the at least one electrochemical cell.

The response detected in block 304 may be analyzed to determine the indication. The analysis may include computing a Fourier transform of the stimulus used in block 302 and the response detected in block 304.

The internal state of the at least one chemical cell may be determined through analysis of the second and/or higher order harmonic components of the response detected in block 304. For example, the detected response may be compared with one or more stored signatures, each indicative of a particular internal state (e.g. degradation, asymmetry, remaining life, charge state, range).

In some examples, the stored signatures may include shapes of Nyquist plots of third harmonic components of responses over a variety of frequencies. In some examples, the stored signatures may include thresholds of real or imaginary portions of the response. For example, an indication of health may be displayed if a measured real portion of a third harmonic component of a response to a stimulus frequency is below a first threshold. An indication of moderate degradation may be displayed if a measured real portion of a third harmonic component of a response to a stimulus frequency is between a first and second threshold. An indication of significant degradation may be displayed if a measured real portion of a third harmonic component of a response to a stimulus frequency is greater than a second threshold.

In some examples, the internal state may be a range available to an electric vehicle using the electrochemical cell. To assess range, the harmonic response of the electrochemical cell is dependent upon the current state of charge of the battery. Accordingly, a value or ratio of the second or higher order harmonics may be used to predict the state of charge, and therefore range, of the electrochemical cell. Degradation and remaining usable life are also related to the size and shape of the harmonics. In some examples the correlation may not necessarily be one to one and machine learning techniques may be used to predict degradation and remaining usable life from the second and/or higher order harmonic responses. In some examples, the harmonic shapes/sizes may be used as features for predicting the internal state of the electrochemical cell (e.g. battery).

Examples of methods described herein may be used as diagnostics for the online detection of degradative of unsafe states during battery (dis)charging.

FIG. 4 illustrates Fourier transforms of a stimulus and response arranged in accordance with examples described herein.

Figure 4A:
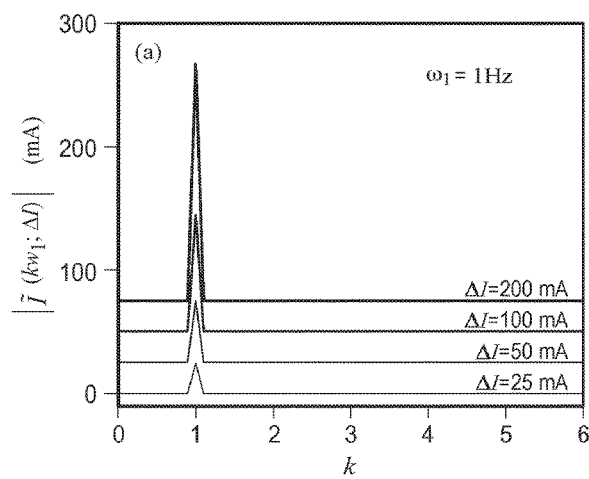
FIG. 4 illustrates Fourier transforms of a stimulus and response arranged in accordance with examples described herein.

FIG. 4a illustrates a Fourier transform of a current stimulus provided to a battery in accordance with examples described herein. The graph in FIG. 4a plots current magnitude in mA against harmonic order k (e.g. 1, 2, 3, etc.). FIG. 4a illustrates the stimulus as a perturbation signal having multiple different amplitudes—25 mA, 50 mA, 100 mA, 200 mA. Generally, the Fourier transform illustrates only a component for a first order harmonic component (e.g. k=1). The magnitude of that component increases with increasing magnitude of the perturbation signal.

Figure 4B:
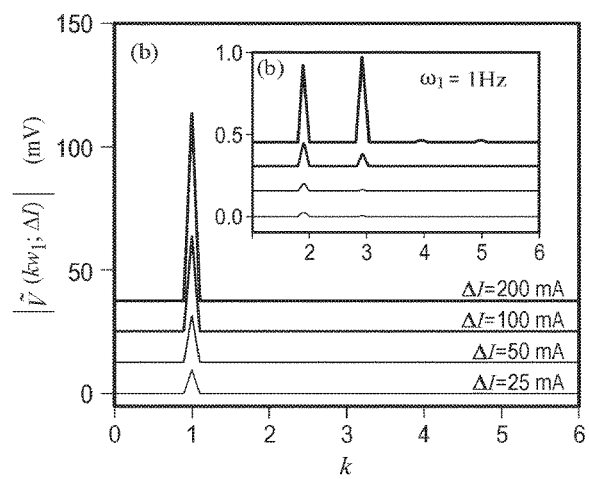

FIG. 4b illustrates a Fourier transform of a voltage response provided from the battery responsive to the stimulus shown in FIG. 4a. The graph in FIG. 4b plots voltage magnitude in mV against harmonic order k (e.g. 1, 2, 3, etc.) FIG. 4b illustrates the stimulus as a perturbation signal having multiple different amplitudes—25 mA, 50 mA, 100 mA, 200 mA. As the amplitude of the perturbation signal increases, an increase may be seen in the presence of second and third order harmonic components (e.g. k=2, k=3). The inset in FIG. 4b illustrates an exploded view of the second and third harmonic components. Note that the harmonic components increase with increasing stimulus amplitude (e.g. perturbation signal amplitude).

From the foregoing it will be appreciated that, although specific embodiments of the invention have been described herein for purposes of illustration, various modifications may be made without deviating from the spirit and scope of the invention.

EXAMPLES

Nonlinear electrochemical impedance spectroscopy (NLEIS) was applied to batteries using a 750 mA-h $Li_xCoO_2/C$ cell purchased from AA Portable Power Corp. (Richmond. Calif.). The cell was held at a 3.8V state of charge and room temperature. Experiments were carried using an Autolab PGSTAT128N potentiostat with a frequency response analyzer module (Autolab FRA32). The measurements used a four electrode configuration with voltage sensing at the cell terminals.

A single cosine current modulation waveform with frequency $\omega_3$ and amplitude $\Delta I$ was sent to the potentiostat:

$$\hat{I}(t;\Delta I,\omega_3)=\Delta I Re[\exp(j\omega_1 t)], \qquad (A)$$

where $j=\sqrt{-1}$, and Re denotes the real component of the bracketed function. The actual time domain current perturbation applied to the battery by the potentiostat, $I(t; \Delta I, \omega_1)$ and the measured voltage response, $V(t; \Delta I, \omega_1)$, were recorded for a wide range of input frequencies ($\omega_1$) and amplitude ($\Delta I$) parameters. Time domain data were recorded after the system had reached a steady periodic state. A minimum of 10 steady periodic cycles were logged with N=4096 time domain measurements for both current and voltage. A rest time of 15 minutes was provided between each frequency sweep to provide a consistent baseline.

Fast Fourier transformation of the steady periodic current and voltage waveforms resulted in spectra containing complex Fourier coefficients at integer multiples, k, of the fundamental frequency, $\omega_1$, $$FFT(I)=\tilde{I}(k\omega_1;\Delta I), \qquad (B)$$

and $$FFT(V)=\tilde{V}(k\omega_1;\Delta I). \qquad (C)$$

As detailed below, the standard (linear) electrochemical impedance $\tilde{\Sigma}(\omega_2)$ is tied to the k=1 Fourier coefficients of current and voltage, whereas the nonlinear electrochemical impedance spectra are tied to the k≥2 voltage Fourier coefficients.

In every experiment performed, the complex Fourier spectra had a harmonic structure comprised of integer k values. The lack of sub-harmonic (0<k<1) or anharmonic (non-integer k) response in the system indicates that the battery (and potentiostat) were stable, in all cases, to the finite amplitude current modulations applied to the battery. The stability of this system allows for a simplified computational approach for estimating the linear and nonlinear response of the system.

A fast analytic-numeric formulation may be used, beginning by expanding all dependent variables in the governing equations and boundary condition in a complex Fourier series $$X(x, t; \Delta I, w_1) = \text{Re}\left\{\sum_{k=0}^{\infty} \tilde{X}_k(x; \Delta I, w_1) \exp(jk\omega_1 t)\right\} = \frac{1}{2}\sum_{k=-\infty}^{\infty} \tilde{X}_k(x; \Delta I, \omega_1) \exp(jkw_1 t) \quad (D)$$

where X denotes any of the dependent variables (such as Li$^+$ concentration or potential in the electrolyte or solid, current, voltage, etc.), $\tilde{X}_k$ are the complex Fourier coefficients for the respective dependent variables, x is the vector of spatial independent variables (x, r), t is time, $\Delta I$ is the current modulation amplitude, and $\omega_1$ is the fundamental frequency of the perturbation.

To analyze the linear and nonlinear harmonic response, we use the pseudo 2-dimensional (P2D) battery model to represent the coupled transport and reaction occurring in our experimental electrochemical cell. This mathematical model includes a set of coupled, nonlinear partial differential equations governing the electrolyte potential ($\varphi$), electrolyte concentration (c), solid-state potential ($\varphi^s$), and solid-state concentration ($c^s$) in the porous electrodes and the electrolyte potential and electrolyte concentration in the separator. Nonlinear current-overpotential relationships at each electrode describe lithium intercalation or deintercalation rates. The effect of double-layer charging, which is typically ignored in dc models, is also included for the solid/electrolyte interfaces of each porous electrode.

The amplitude dependence of these complex Fourier coefficients can be expressed by expanding each in a regular perturbation series in powers of the current modulation amplitude, $$\tilde{X}_k(x; \Delta I, \omega_1) = \sum_{r=0}^{\infty} \Delta I^{k+2r} \tilde{X}_{k,k+2r}(x; \omega_1) \quad (E)$$

The resulting double-indexed complex coefficients $\tilde{X}_{k,p}(x; \omega_2)$ within the summation of Eq. (E) are key frequency dispersion coefficients for the Fourier coefficients at harmonic number, k, and order of nonlinear coupling, p. When k=p=1, the governing equations and boundary conditions represent the linear response of the system to infinitesimal current modulations. When k=p=2, the governing equations and boundary conditions represent the leading order 2$^{nd}$ harmonic response of the system of equations to finite perturbations, and so on. Solutions for p>k, represent corrections to the leading order k=p solutions that can be computed to better match the harmonic response for larger perturbations of the system. Thus, when k=3, and p=3, the sum of two terms in Equation (E) represents a better estimate of the first harmonic Fourier coefficient for the finite amplitude modulation than simply using the first k=1, p=1 term.

The practical implications of this mathematical formalism is fast computation of theoretical linear and nonlinear dynamics of a battery that can be directly compared with experiments. More specifically, the complex voltage Fourier coefficients measured experimentally at each harmonic, k, can be directly computed as $$\tilde{V}_k = \varphi_k^2(x=L; \Delta I, \omega_2) - \varphi_k^2(x=0; \Delta I, \omega_2) \quad (F)$$

where $\varphi_k^2(x=L; \Delta I, \omega_3)$ is the k$^{th}$ Fourier coefficient for the solid state potential evaluated at the boundary of the positive current collector (x=L) and $\varphi_k^2(x=0; \Delta I, \omega_3)$ is the value at the negative current collector (x=0). Using Eq. (E), the leading order approximations for the first three values $\tilde{V}_k$ of are $$\tilde{V}_1(\Delta I, \omega_3) = \Delta I \tilde{Z}_{3,1}(\omega_1) \quad (G)$$

when k=p=1, $$\tilde{V}_2(\Delta I, \omega_3) = \Delta I^2 \tilde{Z}_{2,2}(\omega_2) \quad (H)$$

when k=p=2, and $$\tilde{V}_2(\Delta I, \omega_3) = \Delta I^2 \tilde{Z}_{3,3}(\omega_2) \quad (I)$$

when k=p=3 (here we ignore the dc values at k=p=0). The double indexed coefficient $\tilde{Z}_{1,1}(\omega_1)$ in Eq. (G) is identically equal to the normal (linear) electrochemical impedance of the system. $\tilde{Z}_{2,2}(\omega_1)$ is the leading order nonlinear electrochemical impedance derived from the second harmonic of the voltage response to a pure cosine input current and $\tilde{Z}_{3,3}(\omega_1)$ is the leading order nonlinear electrochemical impedance derived from the third harmonic response.

Fourier coefficients for the current and voltage waveforms measured at the battery terminals, derived from experimental data, given by Equations (B) and (C), are related to the leading order double-index Fourier coefficients we compute, following the formalism of Equations (G)-(I). In particular, $$\tilde{V}(1\omega_1; \Delta I) = \Delta I \tilde{Z}_{1,1}(\omega_1), \quad (J)$$

$$\tilde{V}(2\omega_2; \Delta I) = \Delta I^2 \tilde{Z}_{2,2}(\omega_2), \quad (K)$$

and $$\tilde{V}(3\omega_3; \Delta I) = \Delta I^2 \tilde{Z}_{2,2}(\omega_3). \quad (L)$$

In Equations (J)-(L), measured values from the Fourier transformation of the time domain data (left hand sides), are expected to be dependent on the current modulation amplitude. The coefficients of the power relationships should be, to leading order, equal to what the double-index Fourier coefficients we compute for the linear and nonlinear components of our model. Evidence that this formalism holds will be the functional amplitude dependence predicted in the equations.

Perfect implementation of Equation (A) is challenging for any power amplifier, so under some frequency and amplitude conditions there is measurable harmonic distortion in the power spectrum of the input current waveform (measured total harmonic distortion, THD, is <0.5%). FIG. 4a shows the current input spectrum for $\omega_2$=1 Hz for a range of perturbation amplitudes. FIG. 4b shows a series of corresponding voltage spectra. A practical implication of THD is that we use I(1$\omega_1$; $\Delta I$) rather than $\Delta I$ for calculating the double-indexed Fourier coefficients from experimental data, since it is the actual current modulation amplitude applied to the battery. Harmonic distortion in the input signal also adds a linearly driven contribution to the higher order voltage response. This distortion is most significant at high frequencies; however, for the qualitative analysis presented here, the effect is small enough to be neglected.

In addition to a large peak at the fundamental frequency (k=1), the measured steady periodic voltage response contains measurable signals in the nonlinear harmonics (k≥2). As the battery system is nonlinear, the value of the higher harmonic components (k≥2) depends nonlinearly on the amplitude of the current perturbation and these voltage harmonics appear to grow out of the background as the perturbation amplitude is increased.

Figure 5A:
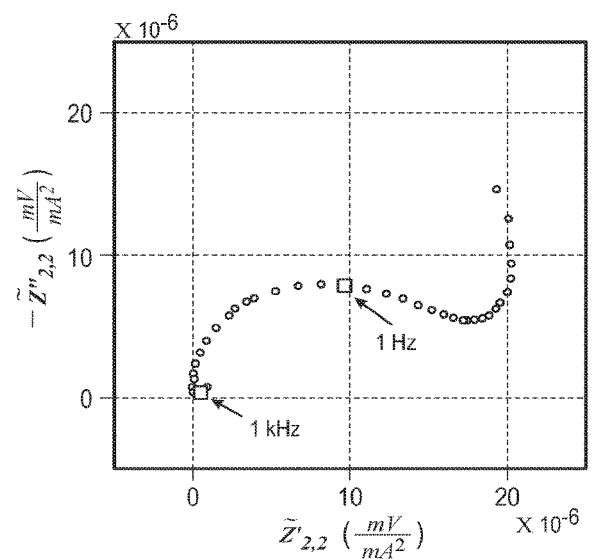
FIG. 5 illustrates measured and predicted second order harmonic components of electrochemical cell responses in accordance with examples described herein.
Figure 5B:
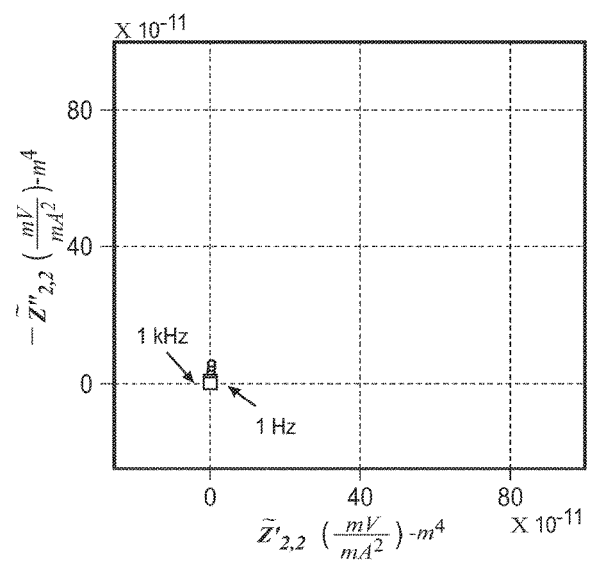

Measuring and computing the double-index voltage coefficients over a range of frequencies provides insights into the system at different physical timescales. FIG. 5 shows a Nyquist representation of the experimentally measured second harmonic response at logarithmically spaced frequencies from 10 kHz to 100 mHz (FIG. 5A) and the computed response spectra of the P2D model using base case parameters for a $Li_xCoO_2$ cell (FIG. 5B). A Nyquist representation of the experimentally measured response was obtained at logarithmically spaced frequencies from 10 kHz to 100 mHz and compared with the computed response spectra of the P2D model using base case parameters for a $Li_xCoO_2$ cell. While the measured and computed first and third, $\tilde{Z}_{2,2}(\omega_3)$ and $\tilde{Z}_{3,3}(\omega_3)$, harmonic coefficients were qualitatively comparable in shape, the measured second harmonic, $\tilde{Z}_{2,2}(\omega_3)$, differs significantly from what the base case parameters predicted computationally (see FIGS. 5A and 5B). While the quantitative differences in $\tilde{Z}_{1,3}(\omega_1)$ and $\tilde{Z}_{3,3}(\omega_3)$ can be attributed to a lack of optimizing the parameters used for the particular batteries examined, the stark difference in shape and size of the $\tilde{Z}_{2,2}(\omega_2)$ computations shows that we are not correctly capturing all of the system's physics.

This difference is captured in the expansion of the Butler-Volmer kinetics resulting in the following second harmonic reaction term, $$j_{2,2} = \frac{i_0(\alpha_a + \alpha_\varepsilon)}{RT}\eta_{2,2}e^{zjwt} + i_0\frac{(\alpha_a^z - \alpha_\varepsilon^z)F}{2R^zT^z}\eta_{3,3}{}^{ze^{zjwt}} \quad (M)$$

where $\eta$ is the overpotential, $i_0$ is the exchange current density, and $\alpha_a$ and $\alpha_2$ are the anodic and cathodic charge transfer coefficients, respectively. When these transfer coefficients are set to 0.5 as is typically assumed in battery models, the second term in Equation (M) vanishes and the second harmonic is close to zero at the frequencies dominated by the reaction kinetics (1 Hz to 1 kHz). The overall symmetry between the kinetics at each electrode is also mathematically present in the second harmonic as the first term in Equation (M), however, analysis shows that this term is small and contributes negligibly to the response for the parameters used.

Figure 6A:
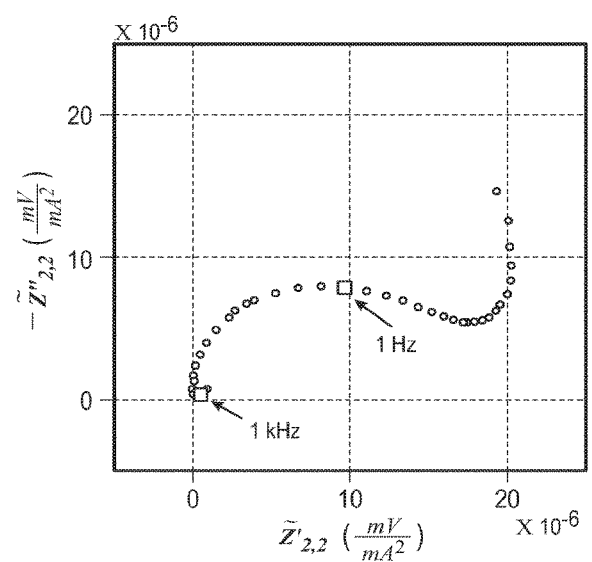
FIG. 6 illustrates measured and predicted second order harmonic components of electrochemical cell responses in accordance with examples described herein
Figure 6B:
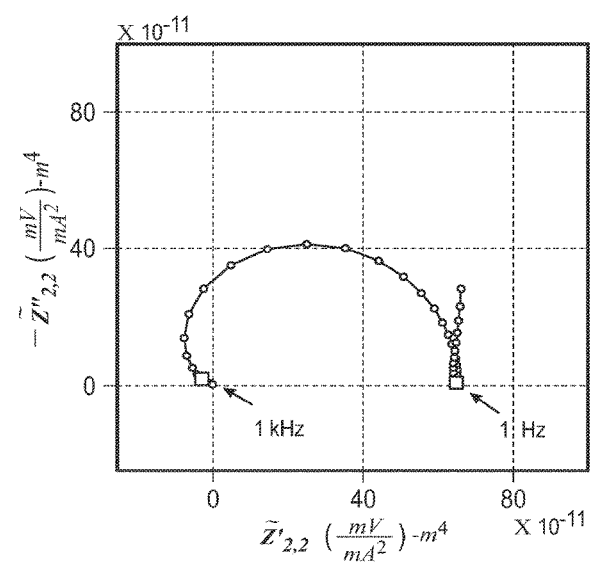

Using non-symmetric charge transfer coefficients results in a behavior which is qualitatively similar to the experimentally measured response. Changing the anodic charge transfer coefficient, $\alpha_a$, from 0.5 to 0.65 for the reaction kinetics at the negative electrode was evaluated. FIG. 6B shows the effect of changing the anodic charge transfer coefficient, $\alpha_a$, from 0.5 to 0.65 for the reaction kinetics at the negative electrode. FIG. 6A is a copy of FIG. 5A for reference, showing the experimentally measured second harmonic component of the battery response. Use of the non-symmetric charge transfer coefficients has improved the shape of the modeled response in FIG. 6B relative to that shown in FIG. 5B. Breaking the symmetry of the reaction at either electrode results in a sizeable response at the frequencies dominated by the reaction kinetics and the phase of the response depends on the direction of symmetry breaking.

Bringing together h formalism of a physics based model for interpreting the nonlinear response with the ability to measure harmonics of the lithium ion battery enables a wide range of future opportunities. For instance, nonlinear impedance based techniques could provide significant improvements over dc methods for noninvasive parameter estimation in P2D models which are used for both model predictive control as well as battery design and optimization.

Accordingly, nonlinear EIS may be applied to lithium ion batteries. A frequency domain formulation of the P2D model may be used as a tool to analyze the higher order harmonics in the voltage response to a moderate amplitude current perturbation. Comparing experimentally measured and computed harmonic coefficients shows that the typical symmetric reaction kinetics used in P2D modeling is not consistent with the measurable second harmonic in the battery.

What is claimed is:

1. A method comprising:
   stimulating non-linear modes of at least one electrochemical cell using a stimulus having a stimulus frequency;
   detecting a response of the at least one electrochemical cell, wherein a response frequency of the response is a second or greater harmonic of the stimulus frequency;
   comparing a Nyquist plot shape of the response to electronic signatures indicative of internal states of electrochemical cells, the electronic signatures comprising Nyquist plot shapes of a second or higher harmonic component;
   based, at least in part, on the comparison, displaying an indication of an internal state of the at least one electrochemical cell, wherein the displaying comprises displaying an indication of degradation of the at least one electrochemical cell when the response exceeds a threshold magnitude; and
   based, at least in part, on the comparison, predicting a remaining useable lifetime of the at least one electrochemical cell.

2. The method of claim 1 wherein displaying the indication of the internal state comprises displaying an indication of degradation.

3. The method of claim 2 wherein the indication of degradation comprises an indication of asymmetry in a charging and discharging behavior of the at least one electrochemical cell.

4. The method of claim 2, wherein the stimulus frequency is selected to be above frequencies at which thermodynamic relationships and slow mass transfer dominate the response.

5. The method of claim 1 wherein the at least one electrochemical cell comprises a lithium ion battery.

6. The method of claim 1 wherein the at least one electrochemical cell comprises a battery in an electric vehicle, and wherein stimulating the non-linear modes of the at least one electrochemical cell comprises applying the stimulus during braking of the electric vehicle.

7. The method of claim 1 wherein the at least one electrochemical cell comprises a battery in an electric vehicle, and wherein stimulating the non-linear modes of the at least one electrochemical cell comprises applying the stimulus using a charging cable of the electric vehicle.

8. The method of claim 1 wherein displaying the indication of the internal state of the at least one electrochemical cell comprises displaying an indication of remaining life of the at least one electrochemical cell.

9. The method of claim 1 wherein the at least one electrochemical cell comprises a battery in an electric vehicle, and wherein displaying the indication of the internal state of the at least one electrochemical cell comprises displaying an indication of estimated range of the electric vehicle using the battery.

10. The method of claim 1, wherein the electronic signatures comprise Nyquist plot shapes of a second or higher harmonic component at different degradation states, and wherein the indication of the internal state comprises an indication of degradation.

11. The method of claim 1, wherein the electronic signatures comprise thresholds of real impedance of a second or higher harmonic component at different degradation states, and wherein the indication of the internal state comprises and indication of degradation.

12. A system comprising:
a signal generator configured to apply a stimulus having a stimulus frequency to at least one electrochemical cell, wherein the stimulus is configured to excite at least one non-linear mode of the at least one electrochemical cell:
measurement circuitry configured to detect a response of the at least one electrochemical cell to the stimulus wherein the response includes a second or greater harmonic component;
a computing device configured to compare a Nyquist plot shape of the response to electronic signatures indicative of internal states of electrochemical cells, the electronic signatures comprising Nyquist plot shapes of a second or higher harmonic component;
a display device configured to display an indication of an internal state of the at least one electrochemical cell based, at least in part on comparing the Nyquist plot shape of the second or greater harmonic component of the response to the electronic signatures, wherein the display device is configured to display an indication of degradation of the at least one electrochemical cell when the response exceeds a threshold magnitude; and
the computing device further configured to, based at least in part on the comparison, predict a remaining useable lifetime of the at least one electrochemical cell.

13. The system of claim 12, wherein the stimulus frequency is selected to be above frequencies at which thermodynamic relationships and slow mass transfer dominate the response.

14. The system of claim 12 wherein the at least one electrochemical cell comprises a battery of an electric vehicle.

15. The system of claim 14 wherein the signal generator comprises a component of a charging system for the electric vehicle.

16. The system of claim 14 wherein the signal generator is configured to apply the stimulus during braking of the electric vehicle.

17. The system of claim 14, wherein the indication of the internal state comprises an indication of a range of the electric vehicle using the battery.

18. The system of claim 12, wherein the indication of the internal state comprises the indication of degradation of the battery.

19. The system of claim 12 further comprising a memory configured to store electronic signatures representative of particular internal states.

20. The system of claim 19 wherein the electronic signatures are derived from empirical data.

21. The system of claim 12 further comprising at least one processing unit and a memory encoded with executable instructions for modeling that, when executed, cause the at least one processing unit to model behavior of the at east one electrochemical cell using parameters for electrode asymmetry.

22. The system of claim 21 wherein the executable instructions for modeling further include instructions for predicting a predicted response of the at least one electrochemical cell and comparing the predicted response with the response, and wherein the indication of the internal state is based, at least in part, on the comparing.

23. The system of claim 22 wherein the executable instructions for modeling further include instructions for fitting a model to the response.

* * * * *